(12) United States Patent
Wang et al.

(10) Patent No.: US 11,949,175 B2
(45) Date of Patent: Apr. 2, 2024

(54) MILLIMETER WAVE ANTENNA TUNER

(71) Applicant: QUALCOMM Incorporated, San Diego, CA (US)

(72) Inventors: Chuan Wang, San Diego, CA (US); Li Liu, San Diego, CA (US); Bhushan Shanti Asuri, San Diego, CA (US); Kevin Hsi-Huai Wang, San Diego, CA (US); Gurkanwal Singh Sahota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 162 days.

(21) Appl. No.: 17/485,332

(22) Filed: Sep. 25, 2021

(65) Prior Publication Data
US 2023/0097074 A1 Mar. 30, 2023

(51) Int. Cl.
| | |
|---|---|
| *H01Q 9/04* | (2006.01) |
| *H01L 23/66* | (2006.01) |
| *H01Q 1/22* | (2006.01) |
| *H01Q 1/24* | (2006.01) |
| *H01Q 1/50* | (2006.01) |
| *H01Q 5/50* | (2015.01) |
| *H01Q 21/28* | (2006.01) |
| *H01Q 23/00* | (2006.01) |

(52) U.S. Cl.
CPC .......... *H01Q 9/0442* (2013.01); *H01L 23/66* (2013.01); *H01Q 1/2283* (2013.01); *H01Q 1/243* (2013.01); *H01Q 1/50* (2013.01); *H01Q 5/50* (2015.01); *H01Q 21/28* (2013.01); *H01Q 23/00* (2013.01); *H01L 2223/6677* (2013.01)

(58) Field of Classification Search
CPC ........ H01Q 1/243; H01Q 1/2283; H01Q 1/50; H01Q 5/50; H01Q 9/0442; H01Q 9/16; H01Q 21/28; H01Q 23/00; H01L 23/66; H01L 2223/6677
See application file for complete search history.

(56) References Cited

U.S. PATENT DOCUMENTS

| | | |
|---|---|---|
| 2009/0153421 A1 | 6/2009 | Rofougaran et al. |
| 2012/0208480 A1 | 8/2012 | Peng et al. |
| 2016/0268992 A1 | 9/2016 | Salfelner et al. |

OTHER PUBLICATIONS

International Search Report and Written Opinion—PCT/US2022/042435—ISA/EPO—dated Nov. 28, 2022.

*Primary Examiner* — Robert Karacsony
(74) *Attorney, Agent, or Firm* — SUNSTEIN LLP/Qualcomm Incorporated

(57) ABSTRACT

Designs and techniques for manufacturing microelectronic antenna tuners are provided. An example microelectronic antenna system includes a radio frequency integrated circuit comprising a plurality of radio frequency signal ports disposed in a first area, a plurality of tuning devices disposed in a second area of the radio frequency integrated circuit, at least one antenna element disposed on a substrate coupled to the radio frequency integrated circuit, and at least one feedline disposed in the substrate and configured to communicatively couple the at least one antenna element, at least one of the plurality of tuning devices, and one of the plurality of radio frequency signal ports.

20 Claims, 14 Drawing Sheets

MILLIMETER WAVE ANTENNA TUNER

BACKGROUND

Wireless communication devices are increasingly popular and increasingly complex. For example, mobile telecommunication devices have progressed from simple phones, to smart phones with multiple communication capabilities (e.g., multiple cellular communication protocols, Wi-Fi, BLUETOOTH® and other short-range communication protocols), supercomputing processors, cameras, etc. Wireless communication devices have antennas to support communication over a range of frequencies.

It is often desirable to have multiple communication technologies, e.g., to enable multiple communication protocols concurrently, and/or to provide different communication capabilities. For example, as wireless communication technology evolves from 4G to 5G or to different wireless local area network (WLAN) standards, for example, mobile communication devices may be configured to communicate using different frequencies, including frequencies below 7 GHz often used for 4G or 5G and some WLAN communications, and millimeter-wave frequencies, e.g., above 23 GHz, for 5G and some WLAN communications. Communicating using different frequencies, however, may be difficult, especially using mobile wireless communication devices with small form factors.

SUMMARY

An example microelectronic antenna system according to the disclosure includes a radio frequency integrated circuit comprising a plurality of radio frequency signal ports disposed in a first area, a plurality of tuning devices disposed in a second area of the radio frequency integrated circuit, at least one antenna element disposed on a substrate coupled to the radio frequency integrated circuit, and at least one feedline disposed in the substrate and configured to communicatively couple the at least one antenna element, at least one of the plurality of tuning devices, and one of the plurality of radio frequency signal ports.

Implementations of such a microelectronic antenna system may include one or more of the following features. At least one of the plurality of tuning devices may include a capacitor. The capacitor may be a variable capacitor. At least one of the plurality of tuning devices may include an inductor. The inductor may be a variable inductor. At least one of the plurality of tuning devices may include at least one capacitor and at least one inductor. A stub tuner may be disposed between the at least one of the plurality of tuning devices and the at least one feedline. The at least one feedline may be configured to communicatively couple the at least one antenna element, at least two of the plurality of tuning devices, and one of the plurality of radio frequency signal ports. The at least one feedline may include a first portion between the at least one antenna element and a second portion between the at least one of the plurality of tuning devices and the one of the plurality of radio frequency signal ports, wherein an electrical property of the first portion and the second portion are different. The electrical property may be a loss level. The at least one feedline may be communicatively coupled to the at least one of the plurality of tuning devices via a first solder bump, and to one of the plurality of radio frequency signal ports via a second solder bump. The at least one antenna element may be at least one of a patch antenna or a dipole antenna. jA distance between the first area and the second area may be in a range from 0.5 millimeters to 5 millimeters. A distance between a radio frequency signal port and a tuning device may be in a range from 0.5 millimeters to 5 millimeters.

An example method of fabricating a microelectronic antenna system according to the disclosure includes coupling a substrate having an antenna element and a feedline to an integrated circuit comprising a radio frequency signal port located in a first area of the integrated circuit, and a tuning device located in a second area of the integrated circuit, wherein the feedline is configured to communicatively couple the radio frequency signal port, the tuning device, and the antenna element.

Implementations of such a method may include one or more of the following features. A stub tuner may be disposed between the tuning device and the feedline. A first solder bump may be disposed on the radio frequency signal port and a second solder bump on the tuning device, wherein the first solder bump and the second solder bump are configured to contact the feedline.

An example radio frequency integrated circuit according to the disclosure includes a plurality of signal ports disposed in a first area, and a plurality of tuning devices disposed in a second area, wherein one or more of the plurality of tuning devices is not connected to any of the plurality of signal ports.

Items and/or techniques described herein may provide one or more of the following capabilities, as well as other capabilities not mentioned. An antenna tuner may include a plurality of radio frequency signal ports in a first area of an integrated circuit and a plurality of tuning devices scattered over a second area of the integrated circuit. Antenna elements may be communicatively coupled to a RF signal port and one or more of the tuning devices via a feedline. The tuning devices may be used to improve the performance of the antenna elements (e.g., gain, bandwidth, return-loss, beamforming, etc.). The scattered tuning devices may utilize empty spaces of the circuit floorplan and reduce the overall dimensions of the circuit. Multiple feedline configurations may be used on the same integrated circuit to support different antenna modules. The costs of developing an antenna module may be reduced. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

DETAILED DESCRIPTION

Designs and techniques for manufacturing millimeter wave (mmW) antenna tuners are discussed. In general, mmW provides wide bandwidths in small cells, which may require a phased array antenna to overcome high signal propagation loss at mmWave. A single phased array antenna module to support multiple mmW bands such as 25 GHz, 28 GHz and 39 GHz is desired to reduce module size and cost. Many mmW antenna systems are being adapted for use in a variety of mobile devices such as smartphones, Internet of Things (IoT) devices, smartwatches, tablets, personal computers, and similar types of user equipment (UE). In general, a mmW antenna may be surrounded by complex mechanical and electrical structures (e.g., housing, display, processors) with various types of materials which may impact the performance of the corresponding transmit and receive chains. For example, the return-loss (RL), bandwidth (BW), gain, and beam patterns may be impacted by the nearby structures. Current broadband mmW modules utilize multi-resonant structures to enhance bandwidth coverage, but these structures may suffer from poor RL and degraded transmit (Tx)/receive (Rx) performance. A mmW antenna tuner may be used to improve RL and Tx/Rx performance, but implementation may be difficult due to mmW frequency requirements and integrated circuit floorplan constraints, for example.

The mmW antenna tuner described herein utilizes a flexible chip floorplan with scattered tuning capacitors and inductors across the chip. In an example, an integrated circuit (IC) may include transceiver components with signal leads in a first area of the IC. A plurality of tuning devices (e.g., capacitors and/or inductors) may be scattered in different areas based at least in part on the space available on the chip floorplan. An antenna module may include antenna elements and feedlines. The location of the feedlines may be designed to communicatively couple an antenna element with one or more of the tuning devices and a signal lead on the transceiver when the IC is mounted on the antenna module. Solder bumps or other conductors may be used to connect the feedlines to the tuning devices and the signal leads. The antenna module may have a plurality of antenna elements and each antenna feedline may be configured to connect to zero, one or more of the tuning elements as required to achieve a desired RL, BW, Tx/Rx and/or gain performance level. Other capabilities and configurations may be provided and not every implementation according to the disclosure must provide any, let alone all, of the capabilities discussed.

Figure 1:
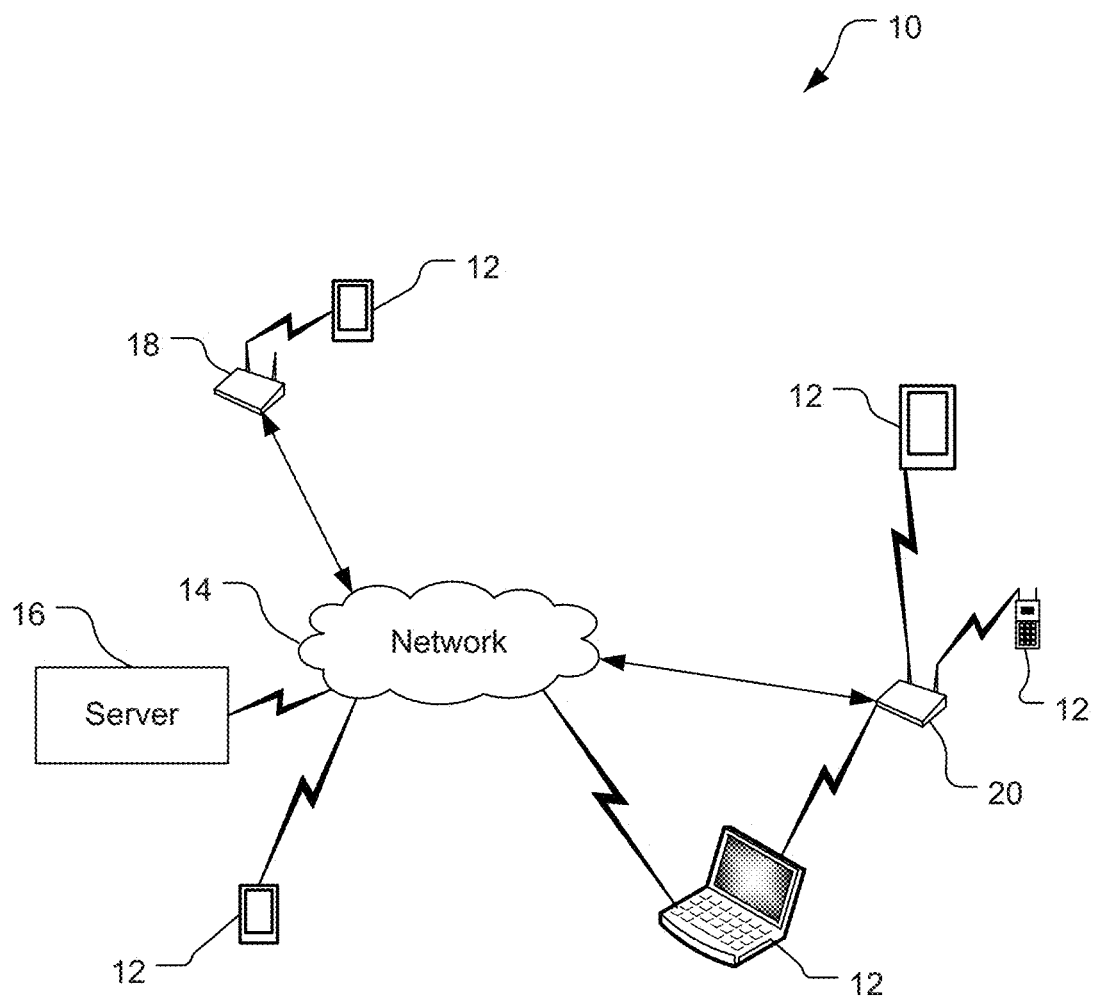
FIG. 1 is a schematic diagram of a communication system.

Referring to FIG. 1, a communication system 10 includes mobile devices 12, a network 14, a server 16, and access points (APs) 18, 20. The system 10 is a wireless communication system in that components of the system 10 can communicate with one another (at least some times using wireless connections) directly or indirectly, e.g., via the network 14 and/or one or more of the access points 18, 20 (and/or one or more other devices not shown, such as one or more base transceiver stations). For indirect communications, the communications may be altered during transmission from one entity to another, e.g., to alter header information of data packets, to change format, etc. The mobile devices 12 shown are mobile wireless communication devices (although they may communicate wirelessly and via wired connections) including mobile phones (including smartphones), a laptop computer, and a tablet computer. Still other mobile devices may be used, whether currently existing or developed in the future. Further, other wireless devices (whether mobile or not) may be implemented within the system 10 and may communicate with each other and/or with the mobile devices 12, network 14, server 16, and/or APs 18, 20. For example, such other devices may include internet of thing (IoT) devices, medical devices, home entertainment and/or automation devices, automotive devices, etc. The mobile devices 12 or other devices may be configured to communicate in different networks and/or for different purposes (e.g., 5G, Wi-Fi communication, multiple frequencies of Wi-Fi communication, satellite positioning, one or more types of cellular communications (e.g., GSM (Global System for Mobiles), CDMA (Code Division Multiple Access), LTE (Long-Term Evolution), Fifth Generation (5G) New Radio (NR), etc.), Bluetooth® communication, etc.).

Figure 2:
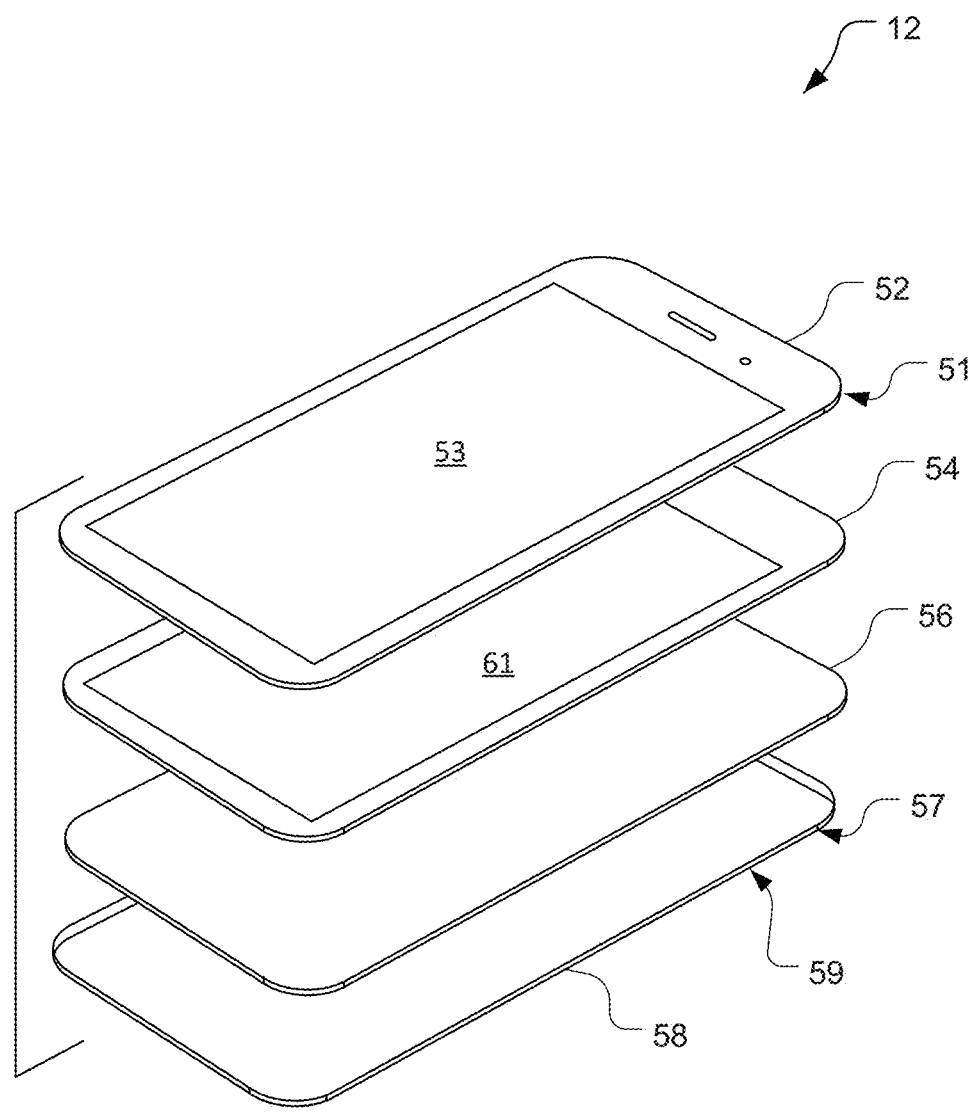
FIG. 2 is an exploded perspective view of simplified components of a mobile device shown in FIG. 1.

Referring to FIG. 2, an example of one of the mobile devices 12 shown in FIG. 1 includes a top cover 52, a display layer 54, a printed circuit board (PCB) layer 56, and a bottom cover 58. The mobile device 12 as shown may be a smartphone or a tablet computer but embodiments described herein are not limited to such devices. The top cover 52 includes a screen 53. The bottom cover 58 has a bottom surface 59. Sides 51, 57 of the top cover 52 and the bottom cover 58 provide an edge surface. The top cover 52 and the bottom cover 58 comprise a housing that retains the display layer 54, the PCB layer 56, and other components of the mobile device 12 that may or may not be on the PCB layer 56. For example, the housing may retain (e.g., hold, contain) or be integrated with antenna systems, front-end circuits, an intermediate-frequency circuit, and a processor discussed below. The housing may be substantially rectangular, having two sets of parallel edges in the illustrated embodiment, and may be configured to bend or fold. In this example, the housing has rounded corners, although the housing may be substantially rectangular with other shapes of corners, e.g., straight-angled (e.g., 45°) corners, 90°, other non-straight corners, etc. Further, the size and/or shape of the PCB layer 56 may not be commensurate with the size and/or shape of either of the top or bottom covers or otherwise with a perimeter of the device. For example, the PCB layer 56 may have a cutout to accept a battery. Those of skill in the art will therefore understand that embodiments of the PCB layer 56 other than those illustrated may be implemented.

Figure 3:
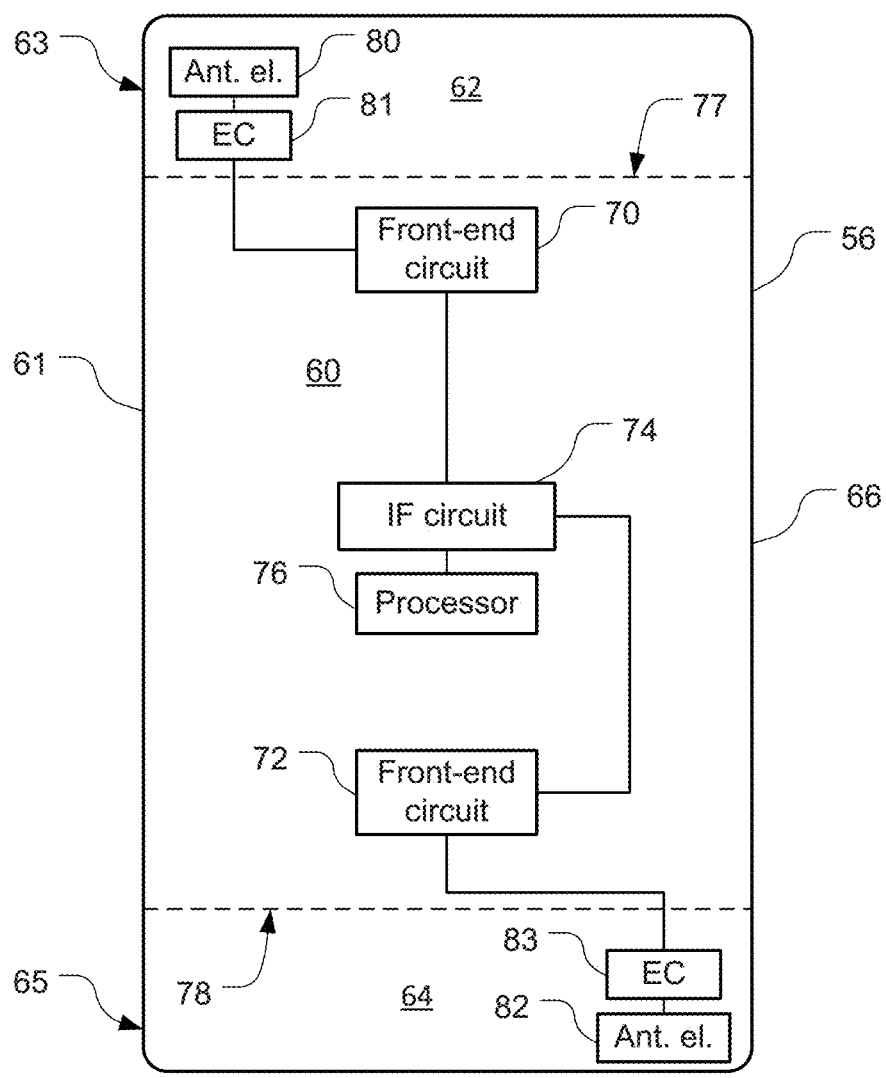
FIG. 3 is a top view of a printed circuit board, shown in FIG. 2, and antennas.

Referring also to FIG. 3, an example of the PCB layer 56 includes a main portion 60 and two antenna systems 62, 64. In the example shown, the antenna systems 62, 64 are disposed at opposite ends 63, 65 of the PCB layer 56, and thus, in this example, of the mobile device 12 (e.g., of the housing of the mobile device 12). The main portion 60 comprises a PCB 66 that includes front-end circuits 70, 72 (also called a radio frequency (RF) circuit), an intermediate-frequency (IF) circuit 74, and a processor 76. The front-end circuits 70, 72 may be configured to provide signals to be radiated to the antenna systems 62, 64 and to receive and process signals that are received by, and provided to the front-end circuits 70, 72 from, the antenna systems 62, 64. The front-end circuits 70, 72 may be configured to convert received IF signals from the IF circuit 74 to RF signals (amplifying with a power amplifier as appropriate), and provide the RF signals to the antenna systems 62, 64 for radiation. The front-end circuits 70, 72 are configured to convert RF signals received by the antenna systems 62, 64 to IF signals (e.g., using a low-noise amplifier and a mixer) and to send the IF signals to the IF circuit 74. The IF circuit 74 is configured to convert IF signals received from the front-end circuits 70, 72 to baseband signals and to provide the baseband signals to the processor 76. The IF circuit 74 is also configured to convert baseband signals provided by the processor 76 to IF signals, and to provide the IF signals to the front-end circuits 70, 72. The processor 76 is communicatively coupled to the IF circuit 74, which is communicatively coupled to the front-end circuits 70, 72, which are communicatively coupled to the antenna systems 62, 64, respectively. In some examples, transmission signals may be provided from the IF circuit 74 to the antenna system 62 and/or the antenna system 64 by bypassing the front-end circuit 70 and/or the front-end circuit 72, for example when further upconversion is not required by the front-end circuit 70 and/or the front-end circuit 72. Signals may also be received from the antenna system 62 and/or the antenna system 64 by bypassing the front-end circuit 70 and/or the front-end circuit 72. In other examples, a transceiver separate from the IF circuit 74 is configured to provide transmission signals to and/or receive signals from the antenna system 62 and/or the antenna system 64 without such signals passing through the front-end circuit 70 and/or the front-end circuit 72. In some examples, the front-end circuits 70, 72 are configured to amplify, filter, and/or route signals from the IF circuit 74 without upconversion to the antenna systems 62, 64. Similarly, the front-end circuits 70, 72 may be configured to amplify, filter, and/or route signals from the antenna systems 62, 64 without downconversion to the IF circuit 74. A super-heterodyne architecture is illustrated in FIG. 3, but a direct conversion architecture may be implemented in some examples.

In FIG. 3, the dashed lines separating the antenna systems 62, 64 from the PCB 66 indicate functional separation of the antenna systems 62, 64 (and the components thereof) from other portions of the PCB layer 56. Portions of the antenna systems 62, 64 may be integral with the PCB 66, being formed as integral components of the PCB 66. One or more components of the antenna system 62 and/or the antenna system 64 may be formed integrally with the PCB 66, and one or more other components may be formed separate from the PCB 66 and mounted to the PCB 66, or otherwise made part of the PCB layer 56. Alternatively, each of the antenna systems 62, 64 may be formed separately from the PCB 66 and coupled to the front-end circuits 70, 72, respectively. In some examples, one or more components of the antenna system 62 may be integrated with the front-end circuit 70, e.g., in a single module or on a single circuit board separate from the PCB 66. For example, the front-end circuit 70 may be physically attached to the antenna system 62, e.g., attached to a back side of a ground plane of the antenna system 62. Also or alternatively, one or more components of the antenna system 64 may be integrated with one or more components of the front-end circuit 72, e.g., in a single module or on a single circuit board. For example, an antenna of the antenna system 62 may have front-end circuitry electrically (conductively) coupled and physically attached to the antenna while another antenna may have the front-end circuitry physically separate, but electrically coupled to the other antenna. The antenna systems 62, 64 may be configured similarly to each other or differently from each other. For example, one or more components of either of the antenna systems 62, 64, may be omitted. As an example, the antenna system 62 may include 4G and 5G radiators while the antenna system 64 may not include (may omit) a 5G radiator. In an example, the antenna systems 62, 64 may be configured for mmW applications. In other examples, an entire one of the antenna systems 62, 64 may be omitted. While the antenna systems 62, 64 are illustrated as being disposed at the top and bottom of the mobile device 12, other locations of the antenna system 62 and/or the antenna system 64 may be implemented. For example, one or more antenna systems may be disposed on a side of the mobile device 12. Further, more antenna systems than the two antenna systems 62, 64 may be implemented in the mobile device 12.

A display 61 (see FIG. 2) of the display layer 54 may roughly cover the same area as the PCB 66, or may extend over a significantly larger area (or at least over different regions) than the PCB 66, and may serve as a system ground plane for portions, e.g., feed lines or other components, of the antenna systems 62, 64 (and possibly other components of the device 12). The PCB 66 may also provide a ground plane for components of the system. The display 61 may be coupled to the PCB 66 to help the PCB 66 serve as a ground plane. The display 61 may be disposed below the antenna system 62 and above the antenna system 64 (with "above" and "below" being relative to the mobile device 12 as illustrated in FIG. 3, i.e., with a top of the mobile device 12 being above other components regardless of an orientation of the device 12 relative to the Earth). In some embodiments, the antenna systems 62, 64 may have widths approximately equal to a width of the display 61. The antenna systems 62, 64 may extend less than about 10 mm (e.g., 8 mm) from edges, here ends 77, 78, of the display 61 (shown in FIG. 3 as coinciding with ends of the PCB 66 for convenience, although ends of the PCB 66 and the display 61 may not coincide). This may provide sufficient electrical characteristics for communication using the antenna systems 62, 64 without occupying a large area within the device 12. In some embodiments, one or more of the antenna systems 62, 64 partially or wholly overlaps with the PCB 66 and/or the display 61. In some embodiments, one or more antenna systems are disposed to the side (relative to the mobile device 12 as illustrated in FIG. 3) of the PCB 66 and/or the display 61. In some embodiments, one or more antenna systems wrap around a corner of the mobile device 12 such that the antenna system is disposed either above or below the PCB 66 and/or the display 61 and also to the side of the PCB 66 and/or the display 61.

The antenna system 62 includes one or more antenna elements 80 and one or more corresponding energy couplers 81, and the antenna system 64 includes one or more antenna elements 82 and one or more corresponding energy couplers 83. The antenna elements 80, 82 may be referred to as "radiators" although the antenna elements 80, 82 may radiate energy and/or receive energy. The energy couplers may be referred to as "feeds," but an energy coupler may convey energy to a radiator from a front-end circuit, or may convey energy from a radiator to the front-end circuit. An energy coupler may be conductively connected to a radiator or may be physically separate from the radiator and configured to reactively (capacitively and/or inductively) couple energy to or from the radiator.

Figure 4:
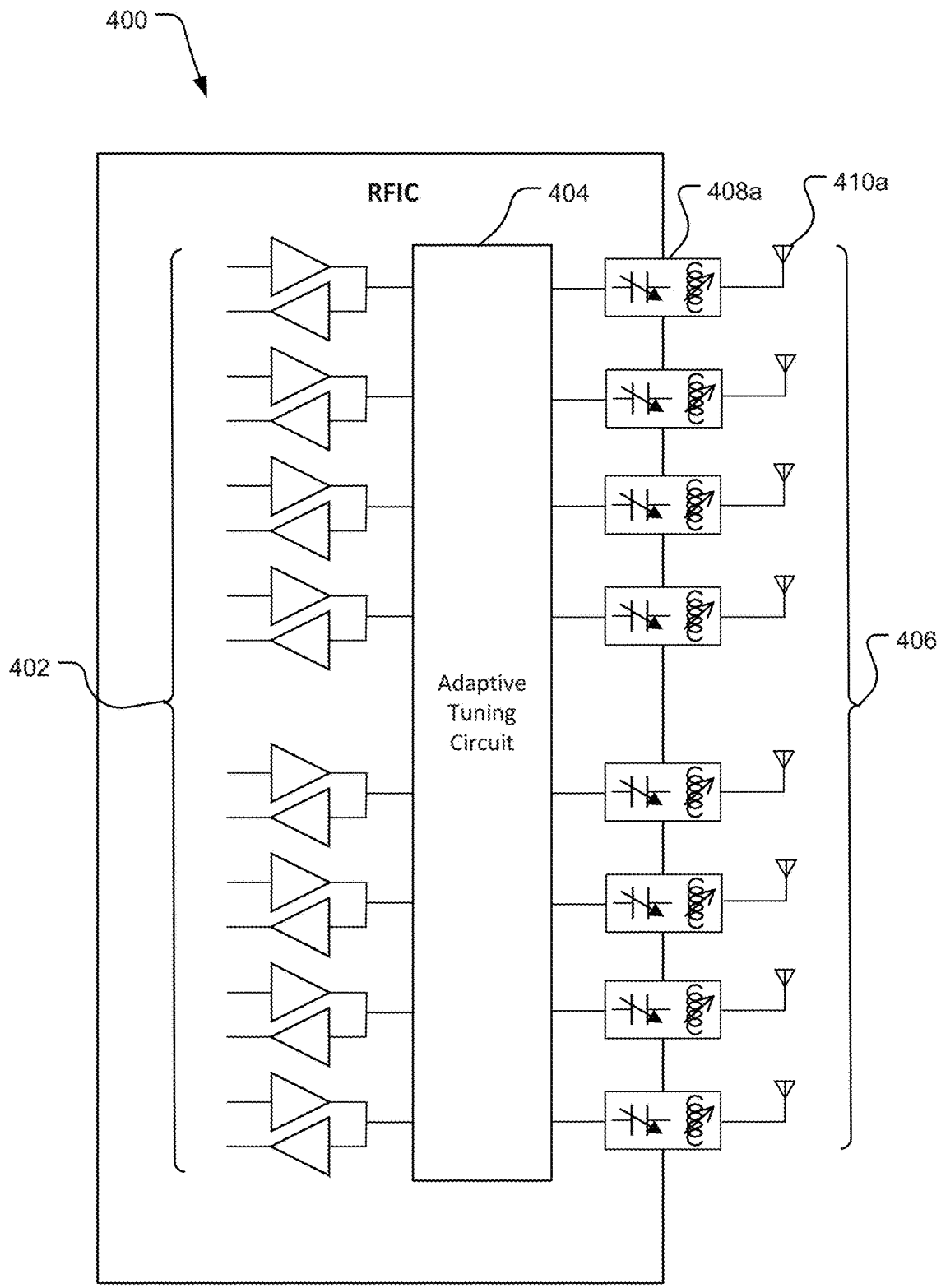
FIG. 4 is a block diagram of an antenna tuning configuration.

Referring to FIG. 4, a diagram 400 of an antenna tuning configuration is shown for comparison with example antenna tuners described below with respect to subsequent figures. The diagram 400 includes a radio frequency integrated circuit (RFIC) with a plurality of transmit and receive chains 402 coupled to one or more adaptive tuning circuits 404, and a plurality of antenna and tuning elements 406. The transmit and receive chains 402 may be examples of the front-end circuits 70, 72 described in FIG. 3. Each of the antenna and tuning elements 406 includes a tuning device and an antenna element, such as the first tuning device 408a and the first antenna element 410a. In some example implementations of the configuration depicted in FIG. 4, the respective connection points (e.g., solder bumps) for each of the transmit and receive chains 402 and the respective tuning device are side by side. Such implementation may increase the floorplan of the RFIC and thus increase the overall circuit form factor. Further, the tuning ranges of the antenna and tuning elements 406 may be limited based on the configuration of the tuning elements. The mmW antenna tuners described below with respect to subsequent figures enable a reduction in circuit footprint and an increased flexibility in tuner design.

Figure 5:
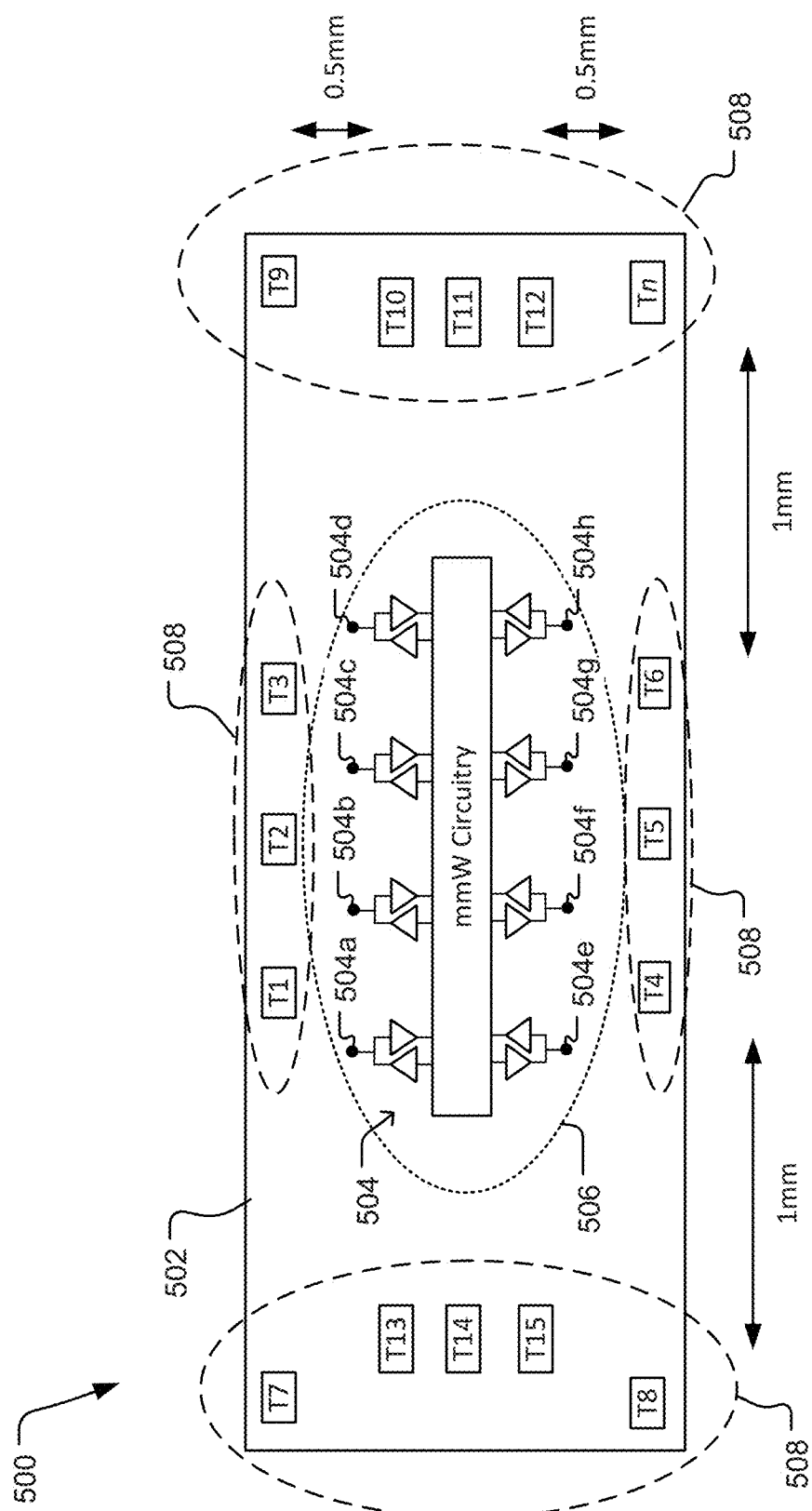
FIG. 5 is a block diagram of an example antenna tuner.

Referring to FIG. 5, a block diagram 500 of an example antenna tuner is shown. The diagram 500 includes an integrated circuit (IC) 502 with mmW circuitry 504 disposed in a first area 506. The IC 502 may be an example of the front-end circuits 70, 72 described in FIG. 3. The IC 502 is an example, and not a limitation, as other substrates and manufacturing techniques as known in the art may be utilized to manufacture integrated circuits. The mmW circuitry 504 includes a plurality of RF signal ports 504a-h within the first area 506 configured to output RF signals (e.g., Tx) or receive RF signals (e.g., Rx). While the mmW circuitry 504 depicts transceiver chains with common signal ports for Tx and Rx, the RF signal ports 504a-h may be associated with independent Tx and Rx chains. The mmW circuitry 504 is an example, and may be configured with fewer or additional signal ports. In the illustrated example, each of the signal ports 504a-h is coupled to a power amplifier for transmitting mmW signals and/or to a low noise amplifier (LNA) for receiving mmW signals. These amplifiers may be coupled to other circuitry for processing mmW signals (illustrated generically in FIG. 5 as a box labeled "mmW Circuitry"). Such other circuitry may include phase shifters, frequency converters (e.g., mixers configured to convert between IF and a mmW frequency), additional amplifiers, signal splitters and/or combiners, etc., but some or all of these other components may not be included in all implementations. The IC 502 includes a plurality of tuning devices T1-Tn scattered throughout a second area 508 on the IC 502. Each of the tuning devices T1-Tn may include one or more capacitors, inductors, variable capacitors, variable inductors, and other discrete devices utilized to modify the impedance of a RF circuit. The properties (e.g., capacitance, inductance, impedance) of each of the tuning devices T1-Tn may vary and thus enable a designer to select one or more of the tuning devices for each antenna element, depending on the housing condition or different Rx/Tx requirement respectively at different frequency bands. The second area 508 may be defined as regions on the IC 502 which are outside of the first area 506 occupied by the mmW circuitry 504 including the corresponding RF signal ports 504a-h.

The distances between signal ports 504a-h and scattered tuning devices T1-Tn may vary from a few hundreds of microns (μms) to a few millimeters (mms) based on band coverage and impedance requirement for the tuning networks. For example, as indicated in FIG. 5, a typical range of approximately 0.5-5 mm between the signal ports 504a-h (e.g., the first area 506) and the tuning devices T1-Tn (e.g., the second area 508) may be used for a 24-33 GHz antenna tuner application. In an example, each of the tuning devices T1-Tn may utilize approximately 0.01 mm$^2$, and may include a switch capacitor or a inductor, a contact pad, and an electrostatic discharge (ESD) structure. Other distances and device configurations may also be used. The tuning devices T1-Tn may be interspersed and scattered in an effort to increase the use of the available area on the IC 502. In an example, groups of tuning devices may be scattered generally in groups in areas such as depicted in FIG. 5. For example, in the corners and along the edges (e.g., top, bottom, right, left).

In an example, the IC 502 may be one or more layers of a multi-layer circuit assembly, such as in a system-on-chip (SoC) device. One or more elements of the mmW circuitry 504 and the tuning devices T1-Tn may be manufactured on a semiconductor substrate (e.g., Si, GaAs, Si on Insulator (SoI), etc.) using deposition, metallization, etching and other semiconductor manufacturing processes as known in the art.

Figure 6:
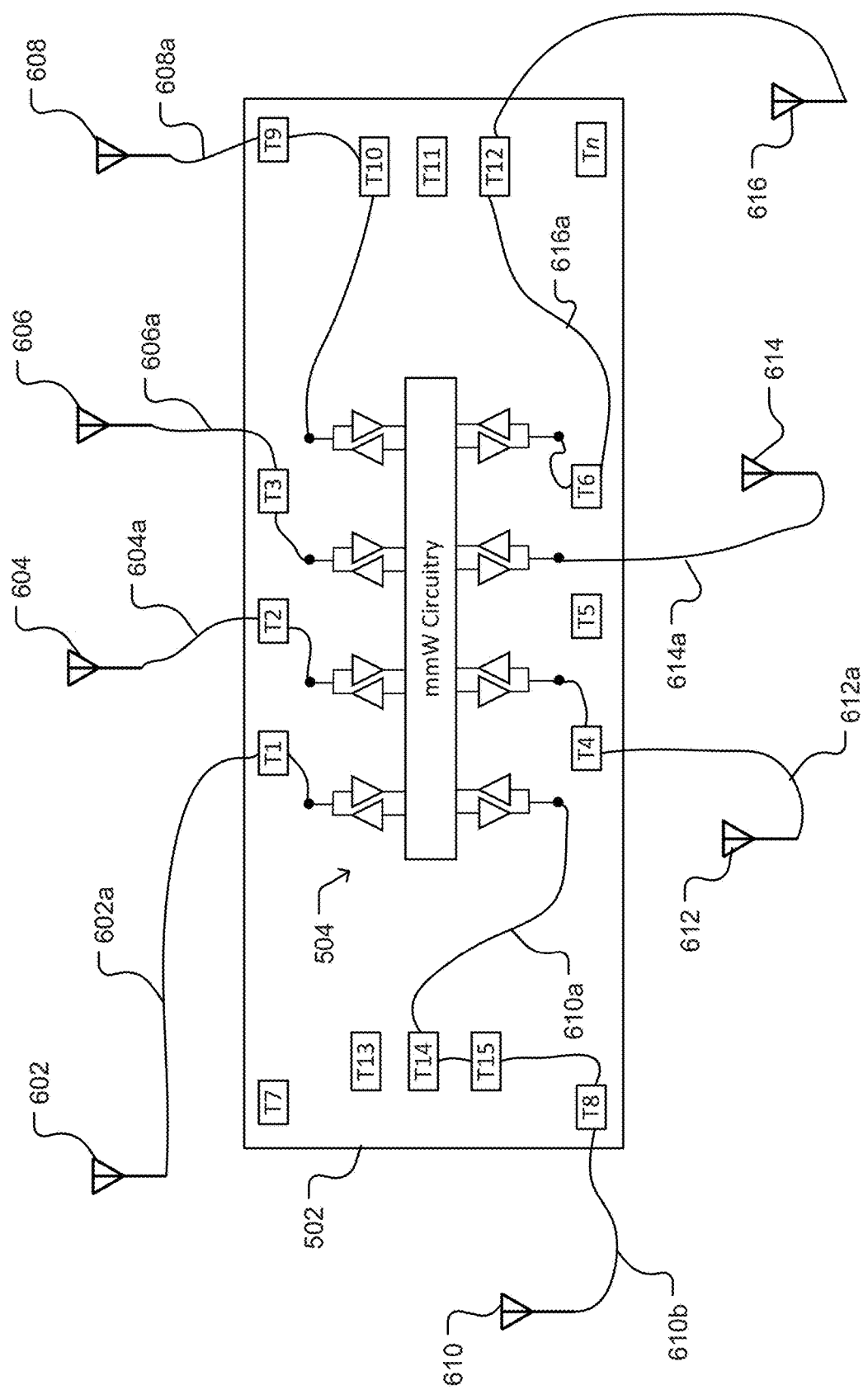
FIG. 6 is a schematic diagram of an example antenna tuner with example feedlines.

Referring to FIG. 6, with further reference to FIG. 5, a schematic diagram of an example antenna tuner with example feedlines is shown. The IC 502 is communicatively coupled to a plurality of antenna elements via a plurality of feedlines. The configurations of the antenna elements and feed lines are examples to highlight the flexibility of the antenna tuner. For example, a first antenna element 602 may be communicatively coupled to a first signal port and a first tuning device T1 via a first feedline 602a. A second antenna element 604 may be communicatively coupled to a second signal port and a second tuning device T2 via a second feedline 604a. A third antenna element 606 may be communicatively coupled to a third signal port and a third tuning device T3 via a third feedline 606a. The properties of the first, second and third tuning devices (T1, T2, T3) may be different and each tuning device may be selected to improve the performance or achieve a certain performance (e.g., RL, BW, gain, beam forming, etc.) of the respective antenna elements. The choice of feeding line length, or chrematistic impedance to connect to different tuning devices, may be also different based on the antenna and corresponding signal bump location. The proposed antenna tuner increases the flexibility of module routing and antenna tuner capability with reduced IC/module area, thus reducing the overall cost of the system.

A feedline may be configured to couple to multiple tuning devices. For example, a fourth antenna element 608 may be communicatively coupled to a fourth signal port, a fourth tuning device T9, and a fifth tuning device T10 via a fourth feedline 608a. A fifth antenna element 610 may be communicatively coupled to a fifth signal port, a sixth tuning device T14, a seventh tuning device T15, and an eighth tuning device T9 via a fifth feedline including a first portion 610a and a second portion 610b. In an example, a feedline may include different materials in different portions. For example, the electrical properties of the first portion 610a may be different than the second portion 610b. The electrical properties may include different Q values and/or loss levels, or other properties impacting the performance of the feedline. Other combinations of signal ports and tuning devices may also be used.

A sixth antenna element 612 may be communicatively coupled to a sixth signal port and a ninth tuning device T4 via a sixth feedline 612a. A seventh antenna element 614 may be communicatively coupled to a seventh signal port via a seventh feedline 614a (e.g., to bypass the tuning devices). An eighth antenna element 616 may be communicatively coupled to an eighth signal port, a tenth tuning device T6, and an eleventh tuning device T12 via an eighth feedline 616a. While the feedlines 602a-616a are shown as crossing the boundary of the IC 502, the feedlines may be implemented separate from the IC (as described in further detail below) and configured to couple ports of the IC 502 to respective antennas and optionally to other ports. The configurations of the signal ports, tuning devices and feedlines are examples, and not limitations. The antenna tuner may have additional scattered tuning devices to implement CLC pi networks to increase the tuning range of an antenna element. The transmit and receive chains of the mmW circuitry 504 may be configured to utilize different tuning devices. The properties and locations of the scattered tuning devices T1-Tn may vary to improve the usage of the circuit floor plan (e.g., to reduce the size of the IC 502). The properties of the tuning devices T1-Tn and the feedlines may be configured based on different use cases (e.g., different customer requirements). In an example, different feedline materials may be used for different portions of the feedlines. For example, the electrical properties of the feedline between the mmW circuitry 504 and a tuning device may be different then the electrical properties of the feedline between the tuning device and an antenna. The antenna tuner increases design flexibility and RF performance while reducing the size of a circuit through efficient use of the floorplan with the scattered tuning elements.

Figure 7:
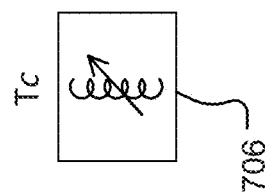
FIG. 7 includes example tuning devices utilized in an antenna tuner.
Figure 7:
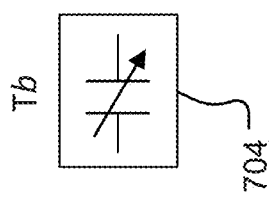
Figure 7:
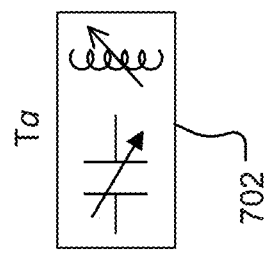

Referring to FIG. 7, with further reference to FIGS. 5 and 6, example tuning devices utilized in an antenna tuner are shown. The tuning devices depicted in FIG. 7 are examples of one or more of the tuning devices T1-Tn described in FIGS. 5 and 6. For example, a first tuning device 702 may include combinations of capacitive and inductive components, with the switching capacitor in the range of several tens of fF to hundreds of fF, and the inductor in the range of several tens of pH to hundreds of pH. A second tuning device 704 may include one or more capacitive components and/or variable capacitors. For example, the second tuning device may include 2 or 3 stacked switched capacitors, in the range of several tens of fF to hundreds of fF. A third tuning device 706 may include one or more inductive components and/or variable inductors, in the range of several tens of pH to hundreds of pH. The tuning devices 702, 704, 706 are examples as other tuning devices may include other components and component configurations to improve the performance of the associated antenna elements. The tuning devices T1-Tn may be scattered independently throughout the second area 508 of the IC 502 without a connection to the mmW circuitry 504. A tuning device may include passive components connected to a ground in the IC 502 and to a solder bump (or other connector) on the surface of the IC 502 without a connection to a RF feedline. For example, referring to FIG. 6, the fifth tuning device T5 and the seventh tuning device T7 are unused on the IC 502 without a connection to an antenna or the mmW circuitry 504. The number and variety of tuning devices T1-Tn in the IC 502 enables flexible antenna module designs because of the multiple options for developing feedline and tuning solutions. In an example, the tuning devices T1-Tn may have active components (e.g., variable capacitors/inductors) and may be communicatively coupled to the IC 502, or other control circuitry, for control purposes but may also be unused for a RF signal path. The number of tuning device T1-Tn may exceed the number required for an RF implementation, and the excess tuning devices (e.g., T5, T7, T11, etc.) may be unused in an operational transceiver.

Figure 8:
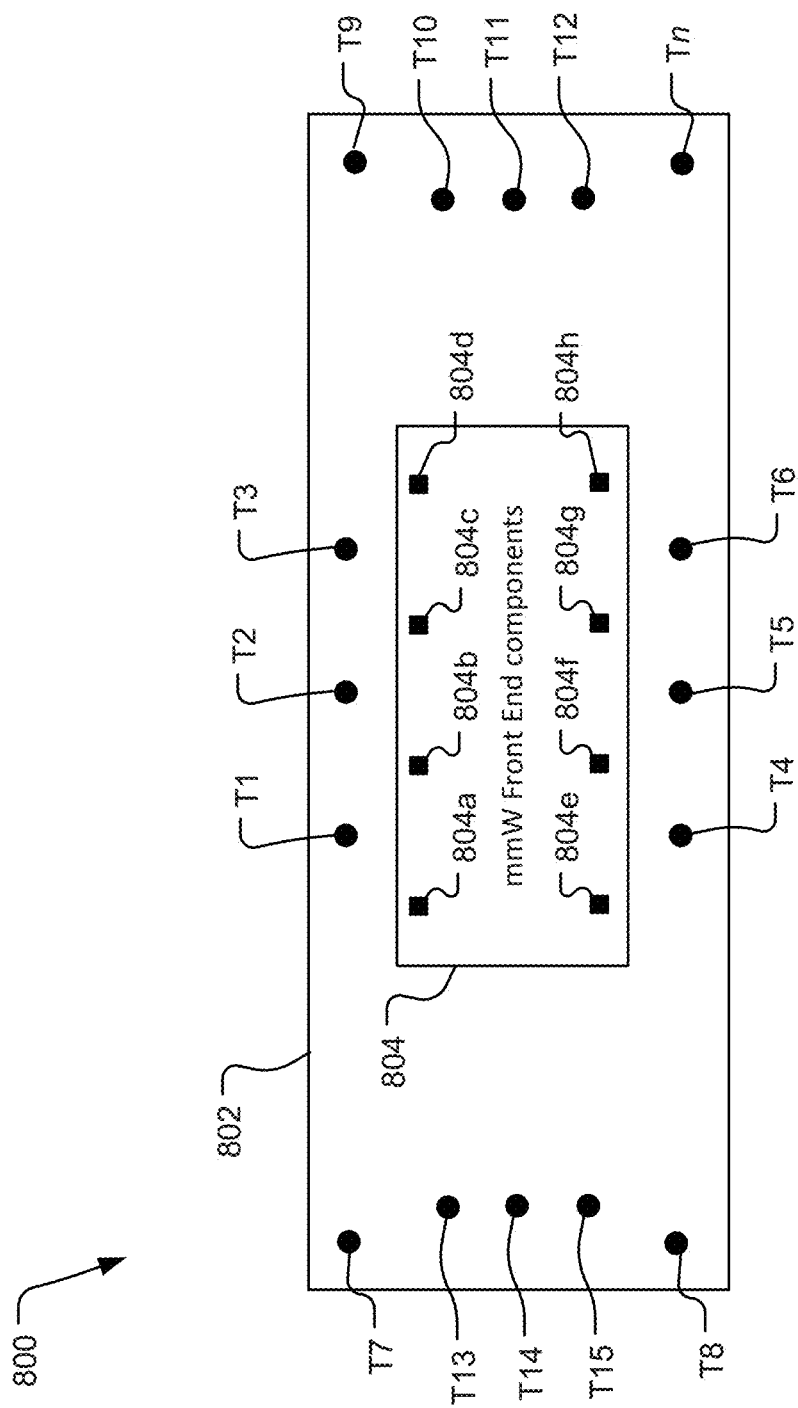
FIG. 8 is a top view of an example circuit with a radio frequency integrated circuit and a plurality of scattered tuning devices.

Referring to FIG. 8, with further reference to FIGS. 5-7, an example circuit 800 with a radio frequency integrated circuit and a plurality of scattered tuning devices is shown. In an embodiment, the circuit 800 includes mmW front end components 804 and a plurality of tuning devices T1-Tn disposed on a substrate 802 comprising a dielectric material (e.g., FR4, prepreg, Teflon, ceramic, polymide, Low Df, etc.). In an embodiment, the circuit 800 may be an integrated circuit or SoC device and the mmW front end components 804 and the plurality of tuning devices T1-Tn may be formed in the substrate 802 using semiconductor manufacturing techniques as known in the art. The mmW front end components 804 may include a plurality of signal ports 804a-h in a first area, such as described in FIG. 5. In an example, the signal ports 804a-h may be contact pads, solder bumps on the IC or SoC, or other conductors configured to enable RF signals in and out of the IC or SoC. The tuning devices T1-Tn may be scattered across a second area of the substrate 802, such as described in FIG. 5, and may include via connectors, solder bumps, or other conductors configured to couple the tuning devices to a feedline. The tuning devices T1-Tn are not connected to the signal ports 804a-h in the circuit 800. In an example, the circuit 800 may be configured as a RFIC configured to connect to an array of antennas in a module. The module may include a dielectric substrate with a plurality of antenna elements and feedlines configured to connect to the signal ports 804a-h and optionally the tuning devices T1-Tn. In an example, the module may include one or more dielectric and metal layers deposited on the circuit 800 in a circuit manufacturing process, such that the feedlines are configure to connect to the signal ports 804a-h and the tuning devices T1-Tn.

Figure 9:
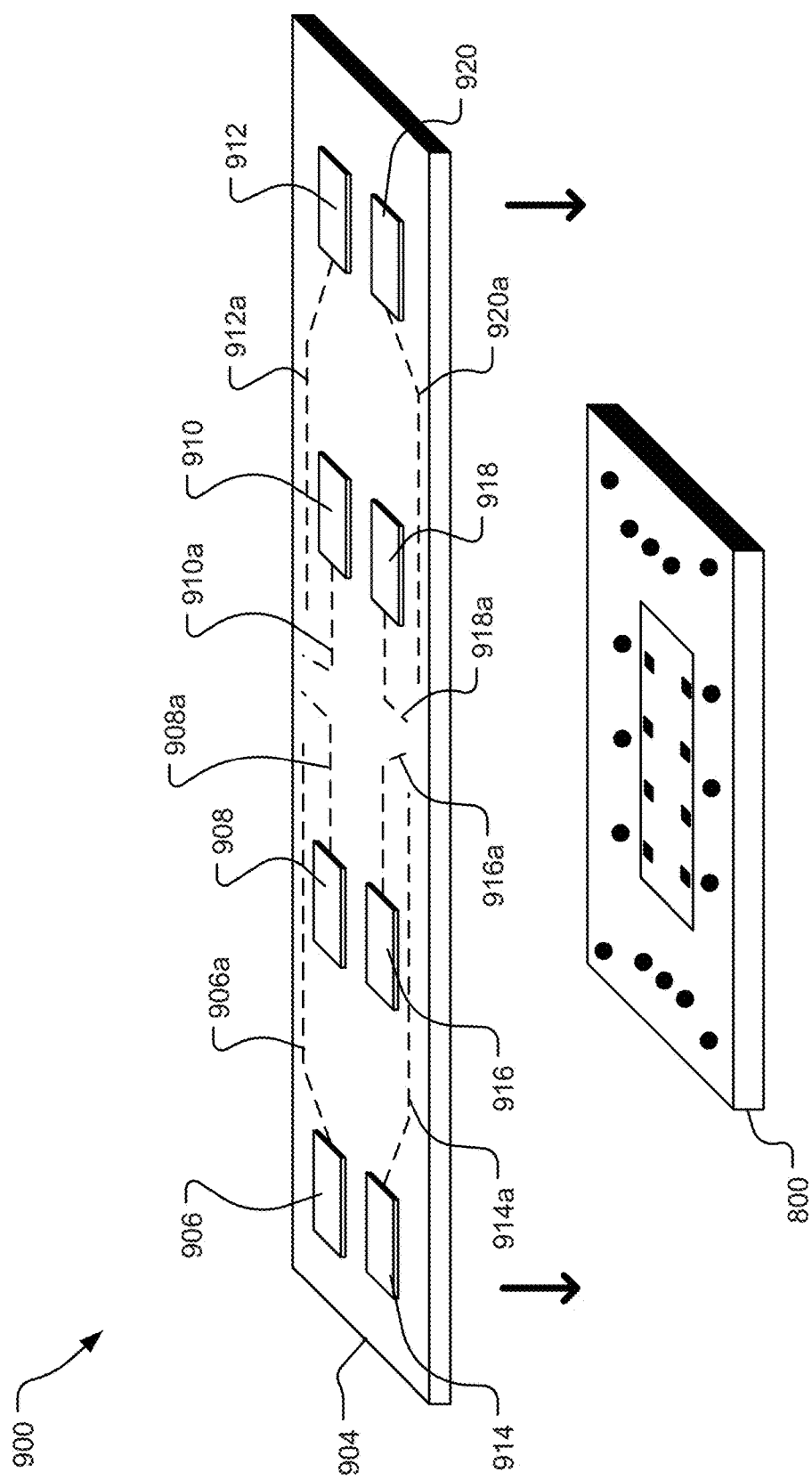
FIG. 9 is a perspective view of the circuit of FIG. 8 and an example antenna module including a plurality of antenna elements and feedlines.

Referring to FIG. 9, with further reference to FIG. 6, a perspective view of the circuit 800 and an example antenna module 900 including a plurality of antenna elements and feedlines is shown. In an example, the antenna module 900 may include a substrate 904 and one or more antenna elements with corresponding feedlines. The locations and configuration of the feedlines are based on the location of the antenna elements as well as the locations of the signal ports 804a-h and the tuning devices T1-Tn of the circuit 800. The antenna elements may be patch antennas, dipole antennas, or other strip or planar antennas as known in the art. In some embodiments, an antenna is formed in multiple layers of the substrate 904, and thus may not be implemented as a strip or planar antenna. For example, a substrate integrate waveguide (SIW) may be implemented. The antenna module 900 may be configured with the substrate 904 coupled to the circuit 800 such that the feed lines make contact with respective signal ports and any tuning devices as required. The example feedlines on the antenna module 900 may be configured as the feedlines described in FIG. 6. For example, a first antenna element 906 may be communicatively coupled to a first signal port 804a and a first tuning device T1 via a first feedline 906a. A second antenna element 908 may be communicatively coupled to a second signal port 804b and a second tuning device T2 via a second feedline 908a. A third antenna element 910 may be communicatively coupled to a third signal port 804c and a third tuning device T3 via a third feedline 910a. A fourth antenna element 912 may be communicatively coupled to a fourth signal port 804d, a fourth tuning device T9, and a fifth tuning device T10 via a fourth feedline 912a. A fifth antenna element 914 may be communicatively coupled to a fifth signal port 804e, a sixth tuning device T14, a seventh tuning device T15, and an eighth tuning device T9 via a fifth feedline 914a. Other combinations of signal ports and tuning devices may also be used.

A sixth antenna element 916 may be communicatively coupled to a sixth signal port 804f and a ninth tuning device T4 via a sixth feedline 916a. A seventh antenna element 918 may be communicatively coupled to a seventh signal port 804g via a seventh feedline 918a (e.g., to bypass the tuning devices). An eighth antenna element 920 may be communicatively coupled to an eighth signal port 804h, a tenth tuning device T6, and an eleventh tuning device T12 via an eighth feedline 920a. While the antenna module 900 depicts a 2×4 antenna array, the configurations of the number and layout of antennas, signal ports, tuning devices and feedlines are examples, and not limitations. Other antenna modules may include different numbers and configurations of antenna elements and/or different antenna arrays (e.g., 1×4, 1×5, 2×4, 2×6, 3×6, 3×8, etc.). In an embodiment, the circuit 800 may be provided as a discrete device (e.g., an RFIC with contact points for the signal ports 804a-h and the tuning devices T1-Tn) and the antenna module 900 may be designed to communicatively couple the substrate 904 to the circuit 800 via solder bumps or other connection technologies. In an embodiment, the circuit 800 and the substrate 904 may be fabricated as a single device with logic, RF, and power components on lower layers, with the radiators and feedlines on the upper layers of an integrated circuit. Other manufacturing techniques may also be used to construct the mmW antenna tuner described herein.

Figure 10:
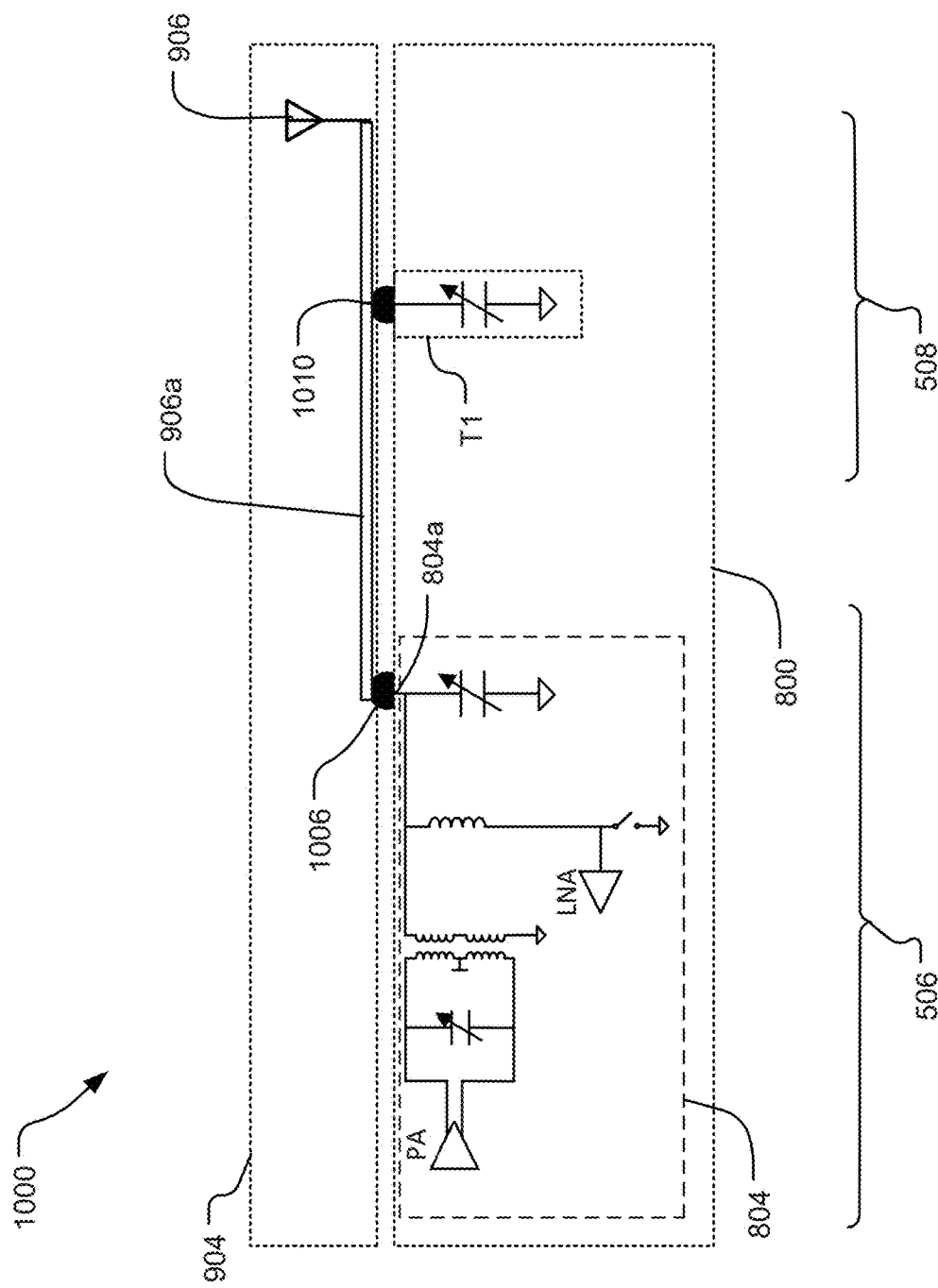
FIG. 10 is a side view of an example antenna tuner configuration with a variable capacitor tuning device.

Referring to FIG. 10, with further reference to FIG. 9, an example antenna tuner configuration 1000 with a variable capacitor tuning device is shown. The configuration 1000 may be one of the antenna feedline examples described in FIGS. 6 and 9. For example, the circuit 800 including the mmW front end components 804 may have a first solder bump 1006 disposed on the first signal port 804a in the first area 506, and a second solder bump 1010 disposed on the first tuning device T1 in the second area 508. In an example, the distance between the first signal port 804a and the first tuning device T1 is approximately 1-5 mm. The substrate 904 includes the first antenna element 906 and the first feedline 906a configured to communicatively couple the first signal port 804a and the first tuning device T1 to the first antenna element 906. In this example, the first tuning device T1 may include capacitive elements such as 2 or 3 stacked switched capacitors. Other variable capacitors and fixed capacitors may also be used in the first tuning element T1. The metal width, or metal stack, or characteristic impedance for the routing between first solder bump 1006 to second solder bump 1010, and the routing between second solder bump 1010 to antenna 906, may be different to achieve the desired impedance tuning range and insertion loss for the antenna tuner. Tunable capacitors within the circuit 800 can be implemented as single or 2 or 3 stacked switched capacitors (or as other types of capacitors) on the primary and/or secondary of the PA output transformer, and are sufficiently rated for the transmit power. However, the eventual size of the tuning capacitors may need to be balanced with receiver mode noise figure consideration. A receiver tuning configuration may be designed to improve noise matching or sensitivity, and a transmitter tuning configuration may be designed to optimize transmit power, linearity, and efficiency.

Figure 11:
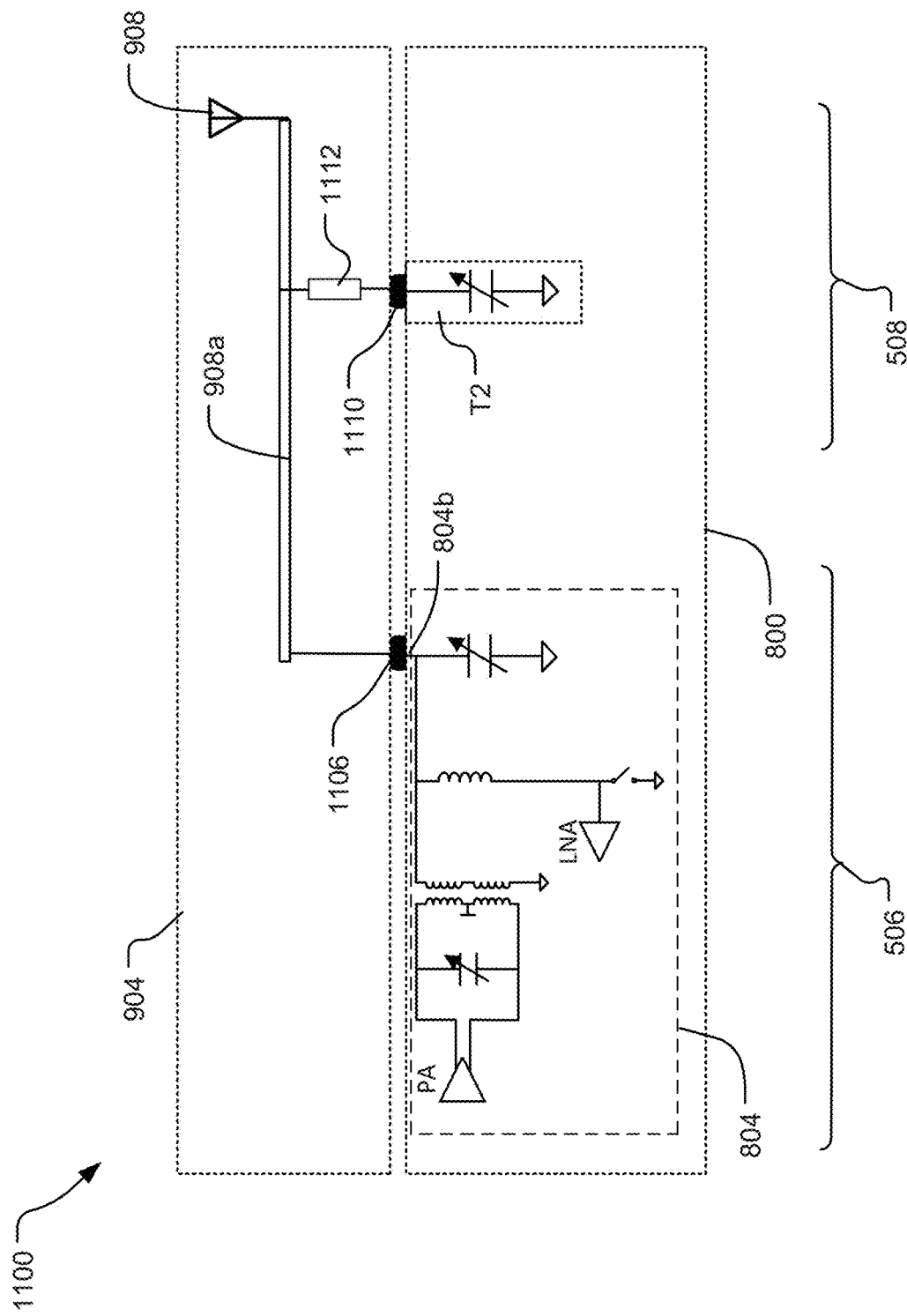
FIG. 11 is a side view of an example antenna tuner configuration with a stub tuner in the antenna module.

Referring to FIG. 11, with further reference to FIG. 9, an example antenna tuner configuration 1100 with a stub tuner in the antenna module is shown. The configuration 1100 may be one of the antenna feedline examples described in FIGS. 6 and 9. For example, the circuit 800 including the mmW front end components 804 may have a third solder bump 1106 disposed on the second signal port 804b in the first area 506, and a fourth solder bump 1110 disposed on the second tuning device T2 in the second area 508. The antenna module 900 includes the second antenna element 908 and the second feedline 908a configured to communicatively couple the second signal port 804b and the second tuning device T2 to the second antenna element 908. The second tuning device T2 may include capacitive elements such as the tuning device 704 in FIG. 7. In an example, a stub tuner 1112 may be disposed between the second tuning device T2 and the second feedline 908a. The stub tuner 1112 may be used, for example, to increase the electrical length of the second feedline 908a to enable phase adjustments in the RF signals transmitted or received by the second antenna element 908.

Figure 12:
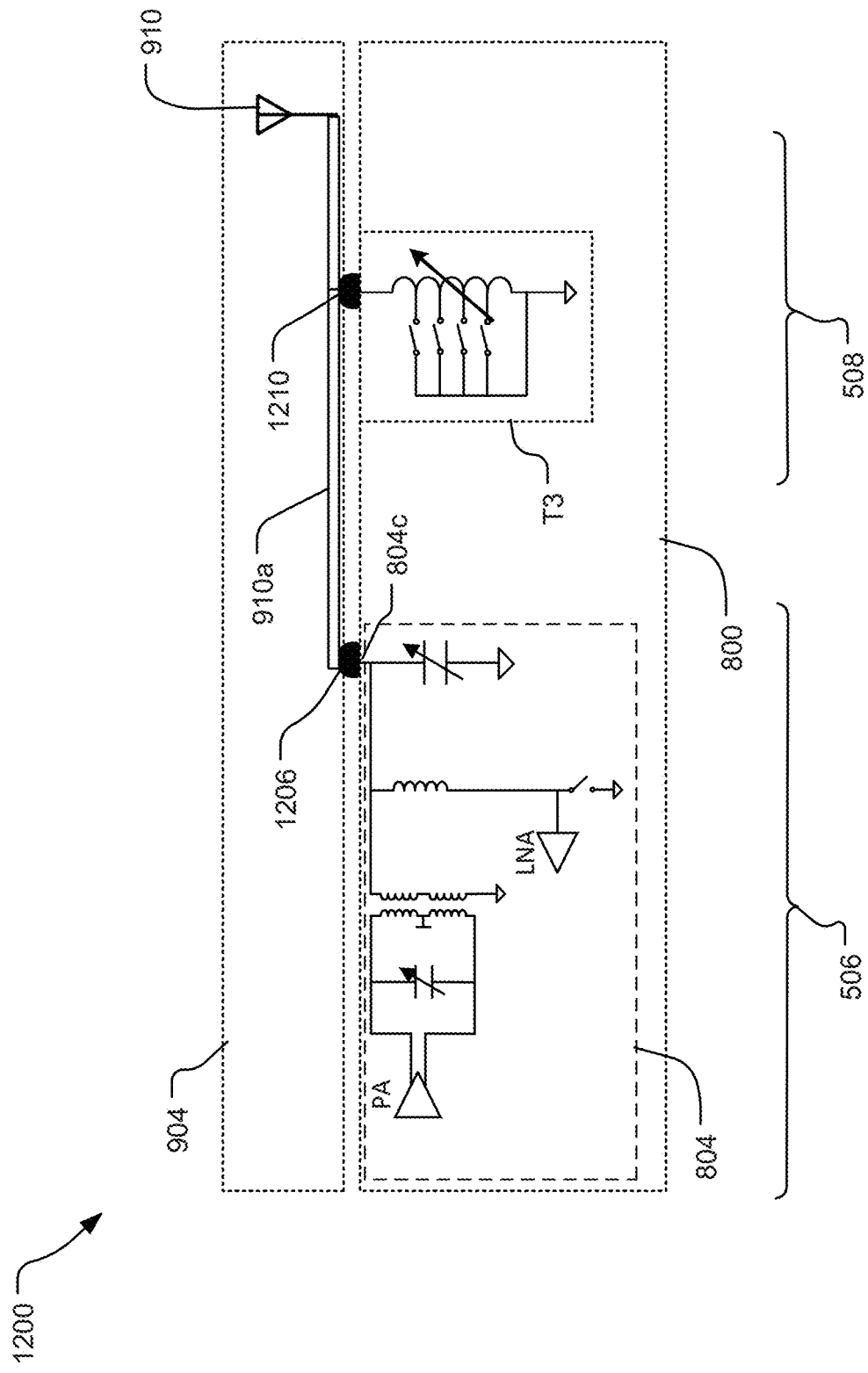
FIG. 12 is a side view of an example antenna tuner configuration with a variable inductor tuning device.

Referring to FIG. 12, with further reference to FIG. 9, an example antenna tuner configuration 1200 with a variable inductor tuning device is shown. The configuration 1200 may be one of the antenna feedline examples described in FIGS. 6 and 9. For example, the circuit 800 including the mmW front end components 804 may have a fifth solder bump 1206 disposed on the third signal port 804c in the first area 506, and a sixth solder bump 1210 disposed on the third tuning device T3 in the second area 508. The antenna module 900 includes the third antenna element 910 and the third feedline 910a configured to communicatively couple the third signal port 804c and the third tuning device T3 to the third antenna element 910. In this example, the third tuning device T3 may include variable inductive elements such as switched inductors. Other variable inductors and fixed inductors may also be used in the third tuning element T3.

Figure 13:
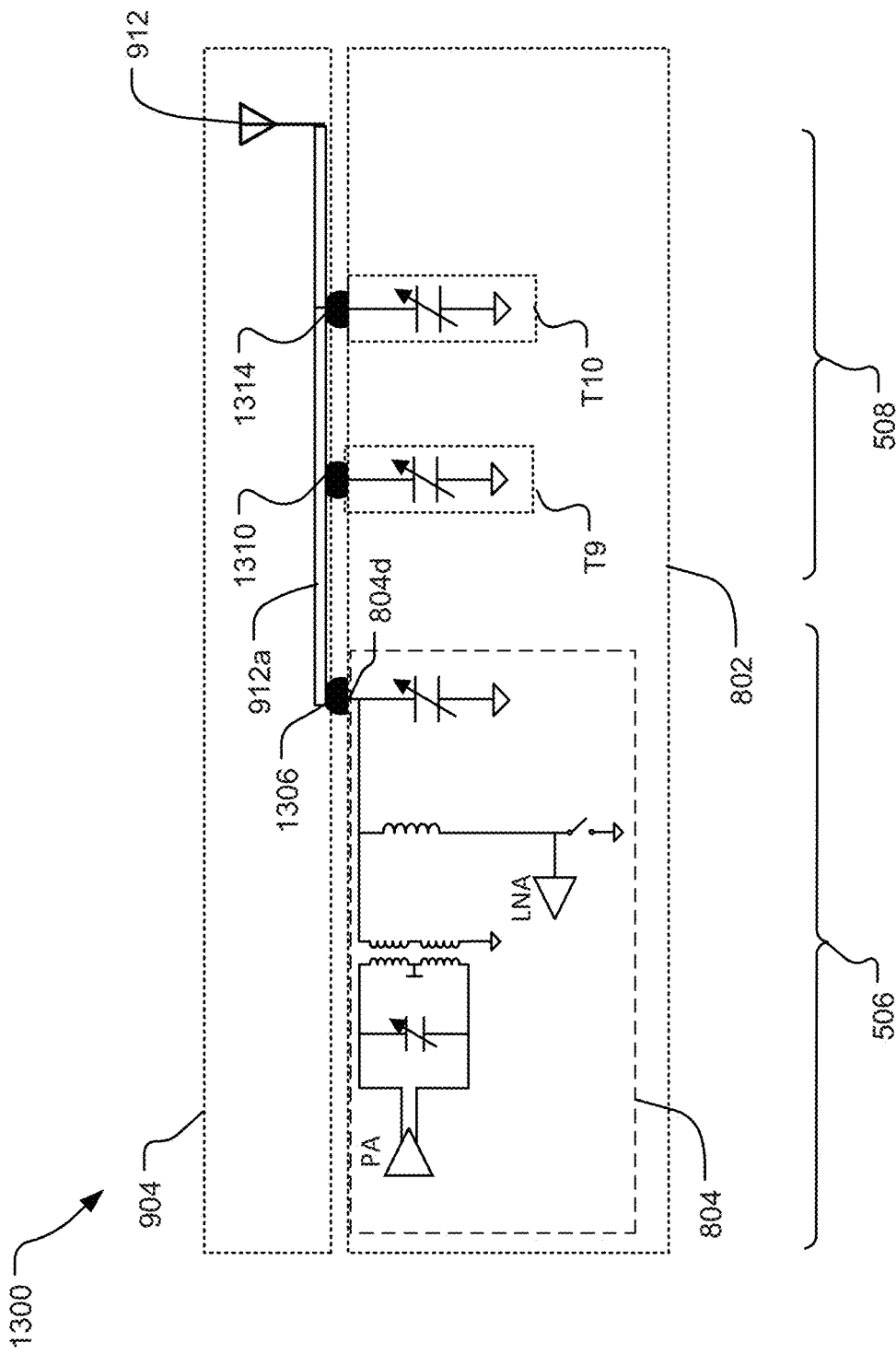
FIG. 13 is a side view of an example antenna tuner configuration with a plurality of scattered tuning devices.

Referring to FIG. 13, with further reference to FIG. 9, an example antenna tuner configuration 1300 with a plurality of scattered tuning devices is shown. The configuration 1300 may be one of the antenna feedline examples described in FIGS. 6 and 9. For example, the circuit 800 including the mmW front end components 804 may have a seventh solder bump 1306 disposed on the fourth signal port 804d in the first area 506, an eighth solder bump 1310 disposed on the fourth tuning device T9, and a ninth solder bump 1314 disposed on the fifth tuning device T10. The fourth and fifth tuning devices T9, T10 are disposed in the second area 508. The antenna module 900 includes the fourth antenna element 912 and the fourth feedline 912a configured to communicatively couple the fourth signal port 804d, the fourth tuning device T9, and the fifth tuning device T10 to the fourth antenna element 912. In this example, the fourth and fifth tuning devices T9, T10 may include variable capacitive elements, but other tuning devices including fixed capacitors, variable inductors and fixed inductors may also be used in one or both of the tuning element T9, T10. A variety of different types and/or sizes of capacitors and/or inductors may be implemented across different tuning devices in an IC (such as the circuit 800), and a module designer may select which of those tuning devices (if any) to connect to an antenna. Further, the metal width, or metal stack, or characteristic impedance for the routing between signal solder bump 1306 to eighth solder bump 1310, the routing between eighth solder bump 1310 and the ninth solder bump 1314, and the routing between the ninth solder bump 1314 to the fourth antenna element 912, may be different to achieve the desired impedance tuning range and insertion loss for the antenna tuner.

In contrast to other antenna tuner concepts, the antenna tuner described herein does not limit the mapping of the tuner bumps and signal bumps. The antenna tuner enables flexible designs for different antenna modules or applications based on antenna module or device housing conditions, RFIC design limitations, a location in a device where the module will be located, desired frequency of communication, or other design criteria. The settings of the antenna tuner may be changed from different frequency band, for different housing condition, as well as for different operation mode (Tx or Rx), to improve phase array performance in different device case conditions and different operation modes.

Figure 14:
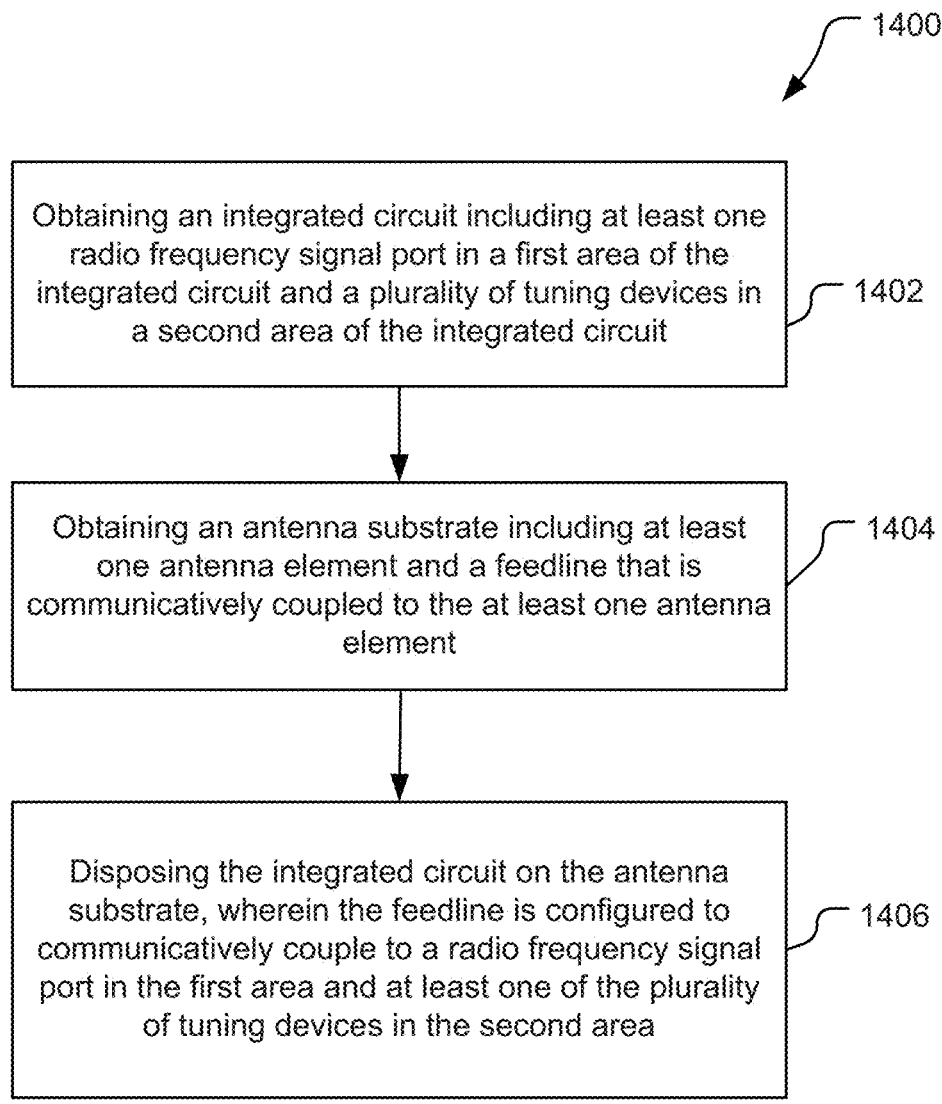
FIG. 14 is a block flow diagram of a method of manufacturing an antenna tuner.

Referring to FIG. 14, a method 140 for manufacturing an antenna tuner includes the stages shown. The method 1400 is, however, an example only and not limiting. The method 1400 may be altered, e.g., by having stages added, removed, rearranged, combined, performed concurrently, and/or having single stages split into multiple stages.

At stage 1402, the method includes obtaining an integrated circuit including at least one radio frequency signal port in a first area of the integrated circuit and a plurality of tuning devices in a second area of the integrated circuit. In an embodiment, the antenna tuner may include an integrated circuit manufactured using PCB fabrication techniques including generating multi-layered substrates with dielectric and metallic films. In an embodiment, the integrated circuit may be generated with semiconductor manufacturing techniques including deposition, etching, metallization, and other processes used to fabricate integrated circuits. Referring to FIG. 8, the integrated circuit may be the circuit 800 including one or more of the signal ports 804*a-h* in a first area (e.g., the first area 506 described in FIG. 5). The plurality of tuning devices T1-Tn are at scattered locations in the second area 508. The plurality of tuning devices T1-Tn may utilize open areas of the floorplan of the integrated circuit. The plurality of tuning devices may include inductive and/or capacitive elements configured to modify the impedance of RF signals transmitted from, or received by, the signal ports.

At stage 1404, the method includes fabricating an antenna substrate including at least one antenna element and a feedline that is communicatively coupled to the at least one antenna element. In an embodiment, the antenna substrate may comprise layers of dielectric substrates and metallic patches and strips. The antenna elements may be patch elements, dipoles, or other antennas. The feedlines may be metal strips designed to communicatively couple an antenna element to a signal port. The location of the feedlines may also be designed to contact one or more of the tuning devices. For example, referring to FIG. 9, the feedlines 906*a*, 908*a*, etc., are configured to electrically connect to one or more of the contacts on the circuit 800 and the tuning devices T1-Tn.

At stage 1406, the method includes disposing the integrated circuit on the antenna substrate, wherein the feedline is configured to communicatively couple to a radio frequency signal port in the first area and at least one of the plurality of tuning devices in the second area. In an embodiment, referring to FIG. 9, the circuit 800 may be connected to the feedlines in substrate 904 via a plurality of solder bumps. For example, the first feedline 906*a* may be communicatively coupled to the first signal port 804*a* via a first solder bump and to the first tuning device T1 via a second solder bump. Other connection techniques may also be used. In an embodiment, the substrate may be disposed on the integrated circuit utilizing PCB layering techniques, such that the first feedline 906*a* may be coupled to the first signal port 804*a* and the first tuning device T1 using electrical via structures. A via structure may include a hole in a dielectric material which is filled with a conductor (e.g., metal) to complete an electrical connection. In PCB manufacturing, vias may be generated by drilling into a substrate to generate the holes and then filling the holes with a heated metal. In semiconductor fabrication, via structures may be formed by deposition and etching processes, and filled by metallization processes. Other processes may also be used. Stage 1406 may further comprise packaging the antenna substrate and integrated circuit together in a module.

The techniques and discussed above are examples, and not exhaustive. Configurations other than those discussed may be used.

As used herein, "or" as used in a list of items prefaced by "at least one of" or prefaced by "one or more of" indicates a disjunctive list such that, for example, a list of "at least one of A, B, or C," or a list of "one or more of A, B, or C" means A or B or C or AB or AC or BC or ABC (i.e., A and B and C), or combinations with more than one feature (e.g., AA, AAB, ABBC, etc.).

The systems and devices discussed above are examples. Various configurations may omit, substitute, or add various procedures or components as appropriate. For instance, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the scope of the disclosure.

The invention claimed is:

1. A microelectronic antenna system, comprising:
  a radio frequency integrated circuit comprising a plurality of radio frequency signal ports disposed in a first area;
  a plurality of tuning devices disposed in a second area of the radio frequency integrated circuit;
  at least one antenna element disposed on a substrate coupled to the radio frequency integrated circuit; and
  at least one feedline disposed in the substrate and configured to communicatively couple the at least one antenna element, at least one of the plurality of tuning devices, and one of the plurality of radio frequency signal ports.

2. The microelectronic antenna system of claim 1 wherein at least one of the plurality of tuning devices includes a capacitor.

3. The microelectronic antenna system of claim 2 wherein the capacitor is a variable capacitor.

4. The microelectronic antenna system of claim 1 wherein at least one of the plurality of tuning devices includes an inductor.

5. The microelectronic antenna system of claim 4 wherein the inductor is a variable inductor.

6. The microelectronic antenna system of claim 1 wherein at least one of the plurality of tuning devices includes at least one capacitor and at least one inductor.

7. The microelectronic antenna system of claim 1 further comprising a stub tuner disposed between the at least one of the plurality of tuning devices and the at least one feedline.

8. The microelectronic antenna system of claim 1 wherein the at least one feedline is configured to communicatively couple the at least one antenna element, at least two of the plurality of tuning devices, and one of the plurality of radio frequency signal ports.

9. The microelectronic antenna system of claim 1 wherein the at least one feedline includes a first portion between the at least one antenna element and a second portion between the at least one of the plurality of tuning devices and the one of the plurality of radio frequency signal ports, wherein an electrical property of the first portion and the second portion are different.

10. The microelectronic antenna system of claim 1 wherein the at least one feedline is communicatively coupled to the at least one of the plurality of tuning devices via a first solder bump, and to one of the plurality of radio frequency signal ports via a second solder bump.

11. The microelectronic antenna system of claim 1 wherein the at least one antenna element is at least one of a patch antenna or a dipole antenna.

12. The microelectronic antenna system of claim 1 wherein a distance between the first area and the second area is in a range from 0.5 millimeters to 5 millimeters.

13. The microelectronic antenna system of claim 1 wherein a distance between a radio frequency signal port and a tuning device is in a range from 0.5 millimeters to 5 millimeters.

14. The microelectronic antenna system of claim 1 wherein the at least one feedline includes a first portion between the at least one antenna element and the at least one of the plurality of tuning devices, and a second portion between the at least one of the plurality of tuning devices and the one of the plurality of radio frequency signal ports.

15. The microelectronic antenna system of claim 1 wherein a first portion of the at least one feedline forms a radio frequency (RF) signal path between the at least one of the plurality of tuning devices and the one of the plurality of radio frequency signal ports.

16. The microelectronic antenna system of claim 8 wherein the at least one feedline includes a first portion between the at least one antenna element and a first tuning device of the at least two of the plurality of tuning devices, a second portion between the first tuning device and a second tuning device of the at least two of the plurality of tuning devices, and a third portion between the second tuning device and the one of the plurality of radio frequency signal ports.

17. The microelectronic antenna system of claim 1 wherein the radio frequency integrated circuit does not include a radio frequency (RF) signal path between the at least one of the plurality of tuning devices and the one of the plurality of radio frequency signal ports.

18. A method of fabricating a microelectronic antenna system, comprising:
coupling a substrate having an antenna element and a feedline to an integrated circuit comprising a radio frequency signal port located in a first area of the integrated circuit, and a tuning device located in a second area of the integrated circuit, wherein the feedline is configured to communicatively couple the radio frequency signal port, the tuning device, and the antenna element.

19. The method of claim 18 further comprising disposing a stub tuner between the tuning device and the feedline.

20. The method of claim 18 further comprising disposing a first solder bump on the radio frequency signal port and a second solder bump on the tuning device, wherein the first solder bump and the second solder bump are configured to contact the feedline.

* * * * *